United States Patent
Ide et al.

(10) Patent No.: US 8,519,704 B2
(45) Date of Patent: Aug. 27, 2013

(54) MAGNETIC-BALANCE-SYSTEM CURRENT SENSOR

(75) Inventors: Yosuke Ide, Niigata-ken (JP);
Masamichi Saito, Niigata-ken (JP);
Akira Takahashi, Niigata-ken (JP);
Tsuyoshi Nojima, Niigata-ken (JP);
Shigenobu Miyajima, Niigata-ken (JP);
Naoki Sakatsume, Niigata-ken (JP);
Kenji Ichinohe, Niigata-ken (JP);
Yoshihiro Nishiyama, Niigata-ken (JP);
Tatsuya Kogure, Niigata-ken (JP);
Hidekazu Kobayashi, Niigata-ken (JP);
Masahiro Iizuka, Niigata-ken (JP)

(73) Assignee: Alps Green Devices Co., Ltd., Tokyo (JP)

( * ) Notice: Subject to any disclaimer, the term of this patent is extended or adjusted under 35 U.S.C. 154(b) by 173 days.

(21) Appl. No.: 13/300,076

(22) Filed: Nov. 18, 2011

(65) Prior Publication Data

US 2012/0062215 A1    Mar. 15, 2012

Related U.S. Application Data (63) Continuation of application No. PCT/JP2010/059791, filed on Jun. 9, 2010.

(30) Foreign Application Priority Data

Jun. 12, 2009 (JP) ................ 2009-141707

(51) Int. Cl.
*G01R 33/09* (2006.01)

(52) U.S. Cl.
USPC ........................................ 324/252

(58) Field of Classification Search
USPC ....................................... 324/252
See application file for complete search history.

(56) References Cited

U.S. PATENT DOCUMENTS

| | | | |
|---|---|---|---|
| 2006/0077598 A1 | 4/2006 | Taylor et al. | |
| 2010/0141251 A1 | 6/2010 | Ando et al. | |

FOREIGN PATENT DOCUMENTS

| | | |
|---|---|---|
| JP | 8-15322 | 1/1996 |
| JP | 8-179023 | 7/1996 |
| JP | 2007-147460 | 6/2007 |
| JP | 2008-275321 | 11/2008 |
| JP | 2008-275566 | 11/2008 |
| JP | 2008-286739 | 11/2008 |

OTHER PUBLICATIONS

Search Report dated Aug. 17, 2010 from International Application No. PCT/JP2010/059791.

*Primary Examiner* — Bot Ledynh
(74) *Attorney, Agent, or Firm* — Beyer Law Group, LLP (57) ABSTRACT

A magnetic-balance-system current sensor includes: a magnetoresistive element, a resistance value of the magnetoresistive element being changed by applying an induction magnetic field generated by a measurement target current; magnetic cores disposed near the magnetoresistive element; a feedback coil disposed near the magnetoresistive element and configured to generate a cancelling magnetic field that cancels out the induction magnetic field; and a magnetic-field detecting bridge circuit having two outputs. The measurement target current is measured on the basis of a current flowing through the feedback coil when the induction magnetic field and the induction magnetic field and the cancelling magnetic field cancel each other out. The feedback coil, the magnetic cores, and the magnetic-field detecting bridge circuit are formed on a same substrate. The feedback coil is of a spiral type, and the magnetic cores are provided above and below the feedback coil.

11 Claims, 9 Drawing Sheets

MEASUREMENT TARGET CURRENT I

FIG. 10A

MEASUREMENT TARGET CURRENT I

FIG. 10B

MEASUREMENT TARGET CURRENT I

MAGNETIC-BALANCE-SYSTEM CURRENT SENSOR

CLAIM OF PRIORITY

This application is a Continuation of International Application No. PCT/JP2010/059791 filed on Jun. 9, 2010, which claims benefit of Japanese Patent Application No. 2009-141707 filed on Jun. 12, 2009. The entire contents of each application noted above are hereby incorporated by reference.

BACKGROUND OF THE INVENTION

1. Field of the Invention

The present invention relates to a magnetic-balance-system current sensor using a magnetoresistive element (a tunneling magnetoresistive element (TMR) element or a giant magnetoresistive element (GMR) element).

2. Description of the Related Art

Motors are driven using electricity generated by engines in electric vehicles. The magnitude of a current used to drive such a motor is detected by, for example, a current sensor. Such a current sensor is a sensor in which a magnetic core, a portion of which has a notch (a core gap), is disposed around a conductor, and in which a magnetic detector element is disposed in the core gap. Examples of such a current sensor include a magnetic-balance-system current sensor illustrated in FIG. 13 (Japanese Unexamined Patent Application Publication No. 8-15322).

Figure 13:
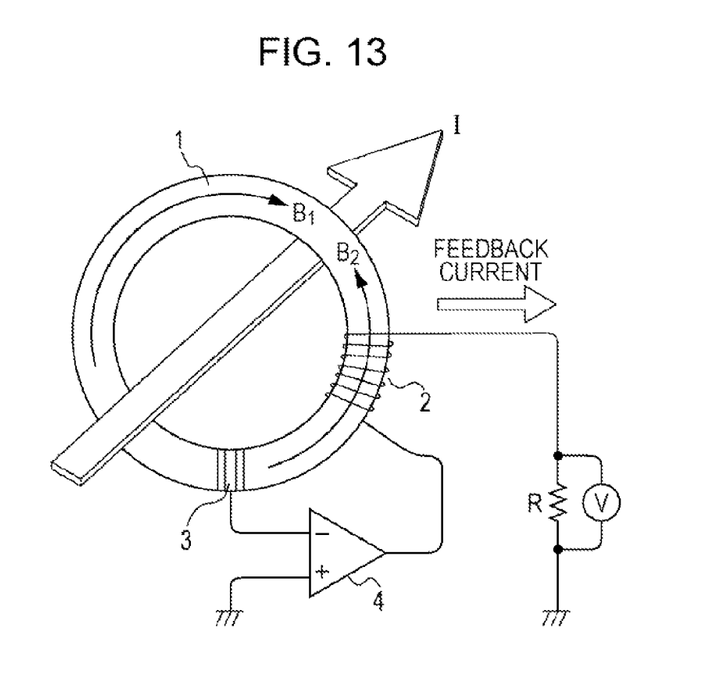
FIG. 13 is a diagram of a magnetic-balance-system current sensor of the related art.

The magnetic-balance-system current sensor illustrated in FIG. 13 has a feedback coil 2 that is wound around a magnetic core 1 in such a direction as to cancel out a magnetic field B1 generated by a measurement target current I. In the magnetic-balance-system current sensor, when the measurement target current I flows, an output voltage is generated in a magnetic detecting element 3 by the magnetic field B1 generated by the current. A voltage signal that is output from the magnetic detecting element 3 is converted into a current. The current is fed back to the feedback coil 2. The magnetic-balance-system current sensor operates so that a magnetic field (a cancelling magnetic field) B2, which is generated by the feedback coil 2, and the magnetic field B1, which is generated by the measurement target current I, cancel each other out and a magnetic field is always zero. In this case, a feedback current flowing through the feedback coil is converted into a voltage, and the voltage is obtained as an output. In FIG. 13, reference numeral 4 denotes an amplifier, and reference numeral R denotes a detection resistor.

In recent years, values of currents that are handled have been rising along with higher output and higher performance of electric vehicles. For this reason, magnetic saturation needs to be prevented when a large current flows. In order to prevent magnetic saturation, the size of magnetic cores needs to be increased. However, there is a problem that, when the size of magnetic cores is increased, the size of current sensors is also increased. Furthermore, in association with the higher performance of electric vehicles, currents need to be more accurately measured, and there is a demand for high-sensitivity current sensors.

SUMMARY OF THE INVENTION

The present invention has been made in view of the above-described issues, and provides a magnetic-balance-system current sensor that can be miniaturized, and that also has a high sensitivity.

A magnetic-balance-system current sensor according to the present invention includes a magnetoresistive element, a feedback coil, and a magnetic-field detecting bridge circuit. A resistance value of the magnetoresistive element is changed by application of an induction magnetic field generated by a measurement target current. The magnetic cores are disposed in the vicinity of the magnetoresistive element. The feedback coil is disposed in the vicinity of the magnetoresistive element, and configured to generate a cancelling magnetic field. The cancelling magnetic field is a field cancelling out the induction magnetic field. The magnetic-field detecting bridge circuit has two outputs having a voltage difference therebetween, and the voltage difference is generated in accordance with the induction magnetic field. The measurement target current is measured on the basis of a current flowing through the feedback coil when electricity is conducted through the feedback coil due to the voltage difference and the induction magnetic field and the cancelling magnetic field enter a state of equilibrium in which the induction magnetic field and the cancelling magnetic field cancel each other out. The feedback coil, the magnetic cores, and the magnetic-field detecting bridge circuit are formed on a same substrate. The feedback coil is of a spiral type, and the magnetic cores are provided above and below the feedback coil.

With this configuration, because the feedback coil, the magnetic cores, and the magnetic-field detecting bridge circuit are formed on the same substrate, the magnetic-balance-system current sensor can be miniaturized although the magnetic-balance-system current sensor has a structure having the magnetic cores. Accordingly, the magnitude of the cancelling magnetic field can be increased, and the measurement target current can be measured even when the measurement target current is a large current. Furthermore, because the magnetoresistive element is used as a magnetic detector element, the sensitivity of the current sensor can be increased.

In the magnetic-balance-system current sensor according to the present invention, it is preferable that the magnetic cores be two magnetic cores, that the magnetoresistive element be disposed between the two magnetic cores, and that the magnetoresistive element and the magnetic cores be formed in a same plane.

In the magnetic-balance-system current sensor according to the present invention, it is preferable that the magnetic cores be provided so that an easy axis of magnetization coincides with a current direction of the feedback coil.

In the magnetic-balance-system current sensor according to the present invention, it is preferable that the feedback coil be provided so that a direction orthogonal to a direction in which the measurement target current flows is an axial center direction, and that the magnetic cores be provided so that an easy axis of magnetization is orthogonal to the axial center direction.

In the magnetic-balance-system current sensor according to the present invention, it is preferable that the magnetoresistive element be a spin-valve-type giant magnetoresistive element or tunneling magnetoresistive element.

In the magnetic-balance-system current sensor according to the present invention, it is preferable that the giant magnetoresistive element have a meandering shape having a width ranging from 1 μm to 10 μm, that a length in a longitudinal direction be equal or larger than twice the width, and that the giant magnetoresistive element be disposed so that the longitudinal direction is perpendicular to both a direction of the induction magnetic field and a direction of the cancelling magnetic field.

In the magnetic-balance-system current sensor according to the present invention, it is preferable that the tunneling magnetoresistive element have a rectangular shape having a width ranging from 1 µm to 10 µm, that a length in a longitudinal direction be equal or larger than twice the width, and that the tunneling magnetoresistive element be disposed so that the longitudinal direction is perpendicular to both a direction of the induction magnetic field and a direction of the cancelling magnetic field.

In the magnetic-balance-system current sensor according to the present invention, it is preferable that the magnetic cores be formed of a high-magnetic-permeability material selected from a group constituted by an amorphous magnetic material, a permalloy magnetic material, and a ferrous microcrystalline material.

DESCRIPTION OF THE PREFERRED EMBODIMENTS

Hereinafter, embodiments of the present invention will be described in detail with reference to the accompanying drawings.

First Embodiment

In a present embodiment, a case will be described, in which a feedback coil is of a toroidal type, and in which magnetic cores are provided inside the feedback coil.

Figure 1:
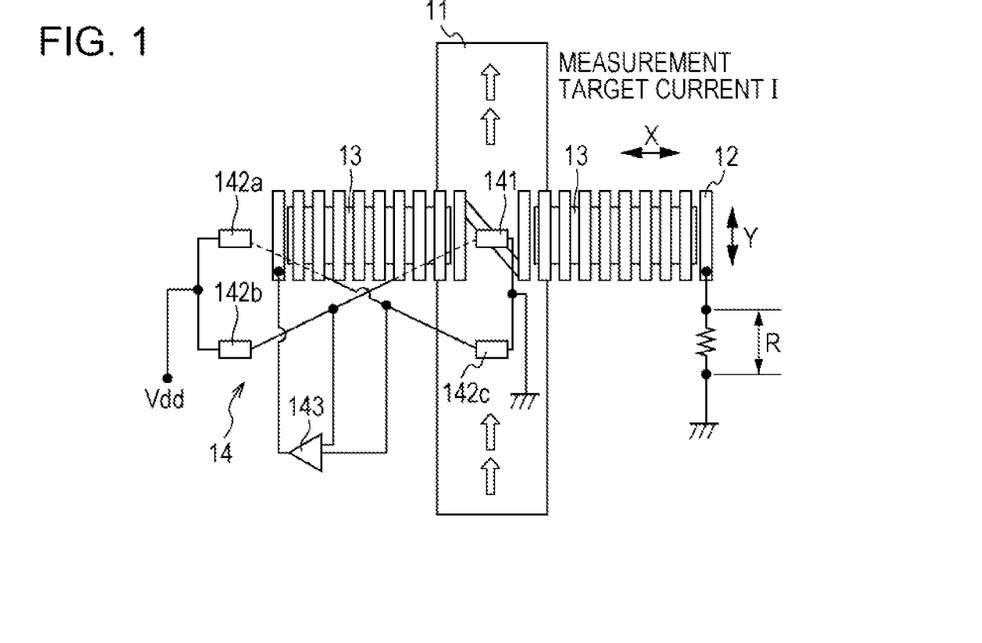
FIG. 1 is a diagram of a magnetic-balance-system current sensor according to a first embodiment of the present invention.

FIG. 1 is a diagram of a magnetic-balance-system current sensor according to the first embodiment of the present invention. The magnetic-balance-system current sensor illustrated in FIG. 1 is disposed in the vicinity of a conductor 11 through which a measurement target current I flows. A feedback coil 12 is disposed so that a direction orthogonal to a direction in which the measurement target current I flows is an axial center direction X. The measurement target current I flows, thereby generating an induction magnetic field, and the feedback coil 12 generates a cancelling magnetic field that cancels out the induction magnetic field.

Furthermore, magnetic cores 13 are disposed so that an easy axis of magnetization is oriented in a direction Y (a direction that coincides with the current direction of the feedback coil 12) that is orthogonal to the axial center direction of the feedback coil 12. When the induction magnetic field generated by the measurement target current I and the cancelling magnetic field are balanced with each other (are in a state of equilibrium) inside the feedback coil 12, the easy axis of magnetization of the magnetic cores 13 is made orthogonal to the axial center direction of the feedback coil 12 so that a magnetic field applied to a magnetoresistive element 141 is zero, whereby a magnetic field caused by remanent magnetization can be prevented from being applied to the magnetoresistive element 141. Furthermore, in this manner, reverse magnetic fields (Hk) of the magnetic cores 13 are increased so that the cancelling magnetic field generated by the feedback coil 12 is not easily saturated, whereby a saturation magnetic field can be excessively increased.

Additionally, the magnetoresistive element 141 is disposed between the two magnetic cores 13. Regarding the magnetoresistive element 141, the resistance value thereof is changed by application of the induction magnetic field generated by the measurement target current I. Together with three fixed resistance elements 142a, 142b, and 142c, the magnetoresistive element 141 constitutes a magnetic-field detecting bridge circuit 14. By using the magnetic-field detecting bridge circuit 14 having the magnetoresistive element 141 as described above, a high-sensitivity magnetic-balance-system current sensor can be realized. Moreover, with this configuration, because the temperature dependency of outputs can be reduced by using a GMR element or TMR element which has a resistance change rate that changes by a small amount for temperature, while temperature coefficient resistivities (TCRs) of the magnetoresistive element and the fixed resistance elements are being made to coincide with each other, the temperature characteristics can be improved.

The magnetic-field detecting bridge circuit 14 has two outputs having a voltage difference therebetween, and the voltage difference is generated in accordance with the induction magnetic field generated by the measurement target current I. In the magnetic-field detecting bridge circuit illustrated in FIG. 1, a power supply Vdd is connected to a node between the fixed resistance elements 142a and 142b, and a ground (GND) is connected to a node between the magnetoresistive element 141 and the fixed resistance element 142c. Furthermore, in the magnetic-field detecting bridge circuit, one output is obtained from a node between the magnetoresistive element 141 and the fixed resistance element 142b, and another output is obtained from a node between the fixed resistance element 142a and the fixed resistance element 142c. These two outputs are amplified by an amplifier 143 so as to be provided as a current (a feedback current) for the feedback coil 12. The feedback current corresponds to the voltage difference generated in accordance with the induction magnetic field. In this case, a cancelling magnetic field that the induction magnetic field cancels out is generated in the feedback coil 12. Then, the measurement target current is measured by a detector (a detection resistor R) on the basis of a current that flows through the feedback coil 12 when the induction magnetic field and the cancelling magnetic field enter a state of equilibrium in which the induction magnetic field and the cancelling magnetic field cancel each other out.

Figure 2A:
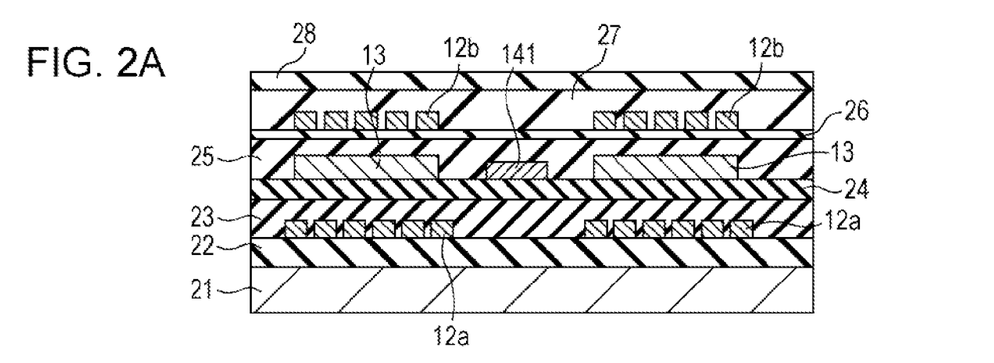
FIG. 2A is a cross-sectional view of the magnetic-balance-system current sensor illustrated in FIG. 1.
Figure 2B:
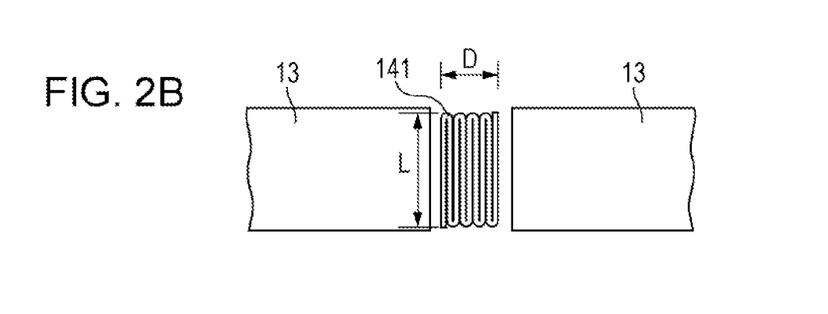
FIG. 2B is an enlarged view of a GMR element that is a magnetoresistive element.

FIG. 2A is a cross-sectional view of the magnetic-balance-system current sensor illustrated in FIG. 1. FIG. 2B is an enlarged view of a GMR element that is the magnetoresistive element. As illustrated in FIG. 2A, in the magnetic-balance-system current sensor according to the present embodiment, the feedback coil 12, the magnetic cores 13, and the magnetic-field detecting bridge circuit 14 are formed on a same substrate 21. In a configuration illustrated in FIG. 2A, the magnetic cores 13 and the feedback coil 12 are disposed in the vicinity of the magnetoresistive element 141. Here, a configuration is employed, in which the magnetoresistive element 141 is disposed between two structures in which the magnetic core 13 is disposed between portions of the feedback coil 12. Moreover, the magnetoresistive element 141 is disposed between the two magnetic cores 13, and the magnetoresistive element 141 and the magnetic cores 13 are formed in the same plane. Because the magnetoresistive element 141 is disposed between the two magnetic cores 13, the induction magnetic field generated by the measurement target current I can be effectively applied to the magnetoresistive element 141. Additionally, because the magnetic cores 13 are disposed inside the feedback coil 12 and the magnetoresistive element 141 is disposed between the two magnetic cores 13, both of the two magnetic fields (the induction magnetic field and the cancelling magnetic field) can be relatively increased with respect to an unnecessary magnetic field such as the geomagnetic field, so that the accuracy of the current sensor can be more increased.

In this case, the feedback coil 12 is disposed so that the axial center direction of the feedback coil 12 is the direction orthogonal to the direction in which the measurement target current I flows. The magnetic cores 13 are disposed so that the easy axis of magnetization is oriented in the direction (the direction that coincides with the current direction of the feedback coil 12) that is orthogonal to the axial center direction of the feedback coil 12.

A layer structure illustrated in FIG. 2A will be described in detail. In the magnetic-balance-system current sensor illustrated in FIG. 2A, a silicon oxide film 22 that serves as an insulating layer is formed on the substrate 21. A silicon oxide film formed by thermal oxidation or a silicon oxide film formed by CVD deposition is used as the silicon oxide film 22. Furthermore, a silicon substrate or the like is used as the substrate 21.

A lower coil layer 12a is formed on the silicon oxide film 22. The lower coil layer 12a can be formed by depositing a film of a coil material and then by performing photolithography and etching. Alternatively, the lower coil layer 12a can be formed by depositing a film of a substrate material and then by performing photolithography and plating.

A polyimide layer 23 is formed as an insulating layer on the silicon oxide film 22, on which the lower coil layer 12a is provided. The polyimide layer 23 can be formed by applying and curing a polyimide material. A silicon oxide film 24 is formed on the polyimide layer 23. The silicon oxide film 24 can be obtained by film deposition using a method such as sputtering.

The magnetic cores 13 are formed on the silicon oxide film 24. The magnetic cores 13 can be formed by depositing a film of a core material and then by performing photolithography and etching. Alternatively, the magnetic cores 13 can be formed by depositing a film of a substrate material and then by performing photolithography and plating. A high-magnetic-permeability material such as an amorphous magnetic material, a permalloy magnetic material, or a ferrous microcrystalline material can be used as a material that the magnetic cores 13 are formed of.

Moreover, the magnetoresistive element 141 is formed on the silicon oxide film 24. In this case, the fixed resistance elements are also provided together with the magnetoresistive element 141, whereby the magnetic-field detecting bridge circuit is built in. A TMR element or a GMR element, or the like can be used as the magnetoresistive element 141. For example, a spin-valve-type GMR element including a multiple-layer film having an antiferromagnetic layer, a fixed magnetic layer, a non-magnetic layer, and a free magnetic layer can be used as the GMR element, or a spin-valve-type TMR element including a multiple-layer film having an antiferromagnetic layer, a fixed magnetic layer, a non-magnetic layer, and a free magnetic layer can be used.

It is preferable that, as a spin-valve-type GMR element, the GMR element be a GMR element having a meandering shape illustrated in FIG. 2B. In this meandering shape, considering linearity, it is preferable that a width D in a pin direction range from 1 μm to 10 μm, and that a length (L) in a longitudinal direction be equal or larger than twice the width (D). In this case, considering linearity, it is preferable that the longitudinal direction be perpendicular to both the direction of the induction magnetic field and the direction of the cancelling magnetic field. With this meandering shape, outputs of the magnetoresistive element can be obtained using the number of terminals (two terminals) that is fewer than the number of Hall elements.

Furthermore, it is preferable that, as a spin-valve-type TMR element, considering linearity, the TMR element be a TMR element having a rectangular shape having a width ranging from 1 μm to 10 μm in a pin direction, and that a length in a longitudinal direction be equal to or larger than twice the width. In this case, considering linearity, it is preferable that the longitudinal direction be perpendicular to both the direction of the induction magnetic field and the direction of the cancelling magnetic field.

A polyimide layer 25 is formed as an insulating layer on the silicon oxide film 24 on which the magnetic cores 13 and the magnetoresistive element 141 are provided. The polyimide layer 25 can be formed by applying and curing a polyimide material. A silicon oxide film 26 is formed on the polyimide layer 25. The silicon oxide film 26 can be obtained by film deposition using a method such as sputtering.

An upper coil layer 12b is formed on the silicon oxide film 26. The upper coil layer 12b can be formed by depositing a film of a coil material and then by performing photolithography and etching. Alternatively, the upper coil layer 12b can be formed by depositing a film of a substrate material and then by performing photolithography and plating.

A polyimide layer 27 is formed as an insulating layer on the silicon oxide film 26 on which the upper coil layer 12b is provided. The polyimide layer 27 can be formed by applying and curing a polyimide material. A silicon oxide film 28 is formed as a protective layer on the polyimide layer 27. The silicon oxide film 28 can be obtained by film deposition using a method such as sputtering.

Figure 3A:
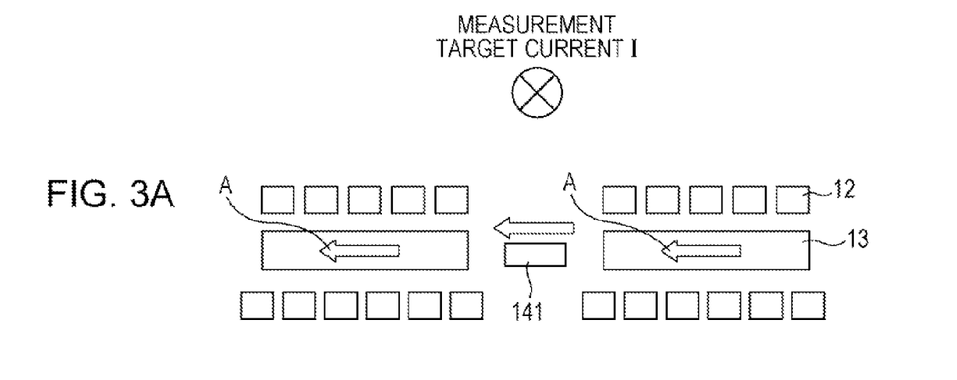
FIGS. 3A to 3C are diagrams for explaining an operation principal of the magnetic-balance-system current sensor.
Figure 3B:
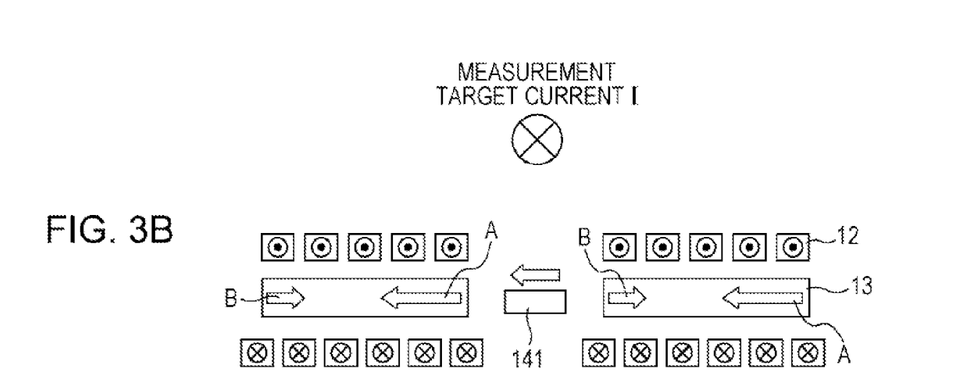
Figure 3C:
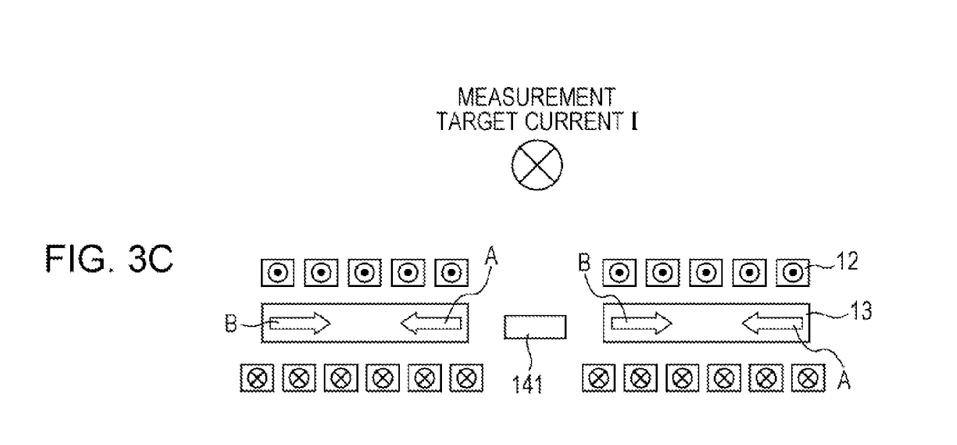

In the magnetic-balance-system current sensor having the above-described structure, as illustrated in FIG. 3A, an induction magnetic field A generated by the measurement target current I is applied to the magnetoresistive element 141 through the magnetic cores 13. As illustrated in FIG. 3B, the induction magnetic field is fed back, and a cancelling magnetic field B is generated by the feedback coil 12. As illustrated in FIG. 3C, adjustment is appropriately performed so that the two magnetic fields (the induction magnetic field A and the cancelling magnetic field B) cancel each other out and a magnetic field applied to the magnetoresistive element 141 is zero.

Regarding the magnetic-balance-system current sensor having the above-described configuration, because the feedback coil 12, the magnetic cores 13, and the magnetic-field detecting bridge circuit 14 are formed on the same substrate, the magnetic-balance-system current sensor can be miniaturized although the magnetic-balance-system current sensor has a structure having the magnetic cores 13. Accordingly, the magnitude of the cancelling magnetic field can be increased, and, even when the measurement target current is a large current, the measurement target current can be measured. Moreover, because the magnetoresistive element, particularly, a GMR element or TMR element, is used as a magnetic detector element, the sensitivity of the current sensor can be increased.

Next, Examples that were implemented in order to make effects of the present invention clear will be described.

Figure 4:
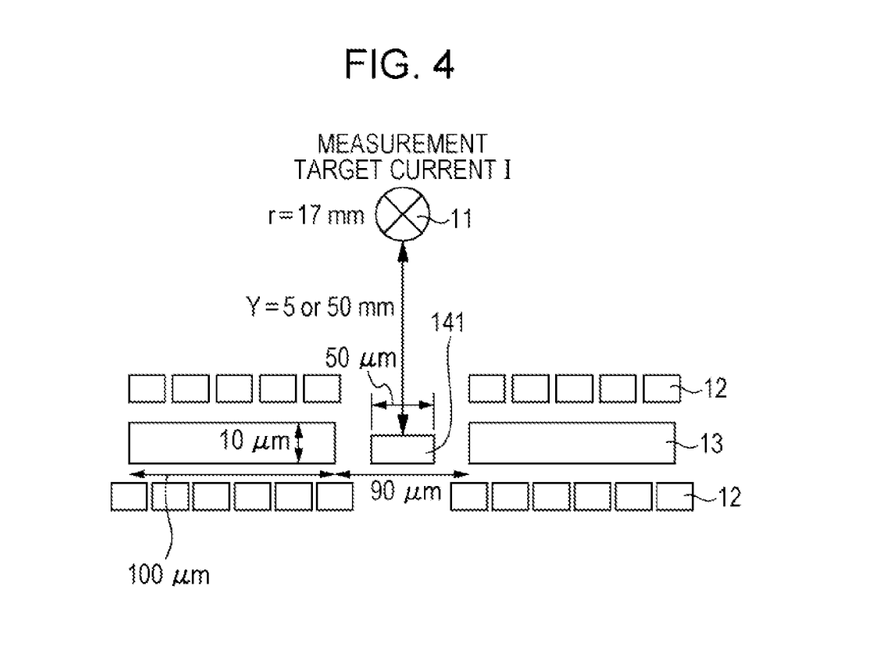
FIG. 4 is a diagram illustrating a configuration of a magnetic-balance-system current sensor used to measure the magnitude of a magnetic field that is applied to a magnetoresistive element for a measurement target current.

FIG. 4 is a diagram illustrating a configuration of a magnetic-balance-system current sensor used to measure the magnitude of a magnetic field that is applied to a magnetoresistive element for a measurement target current. Regarding the magnetic-balance-system current sensor illustrated in FIG. 4, two magnetic cores (NiFe) 13 having a thickness of 10 µm and a length of 100 µm are disposed inside a feedback coil (Cu) 12. The distance between the magnetic cores 13 is 90 µm. A magnetoresistive element 141 having a length of 50 µm is disposed between the two magnetic cores 13. In this configuration, the feedback coil 12, the magnetic cores 13, and a magnetic-field detecting bridge circuit (not illustrated) are formed on the same substrate.

Figure 5:
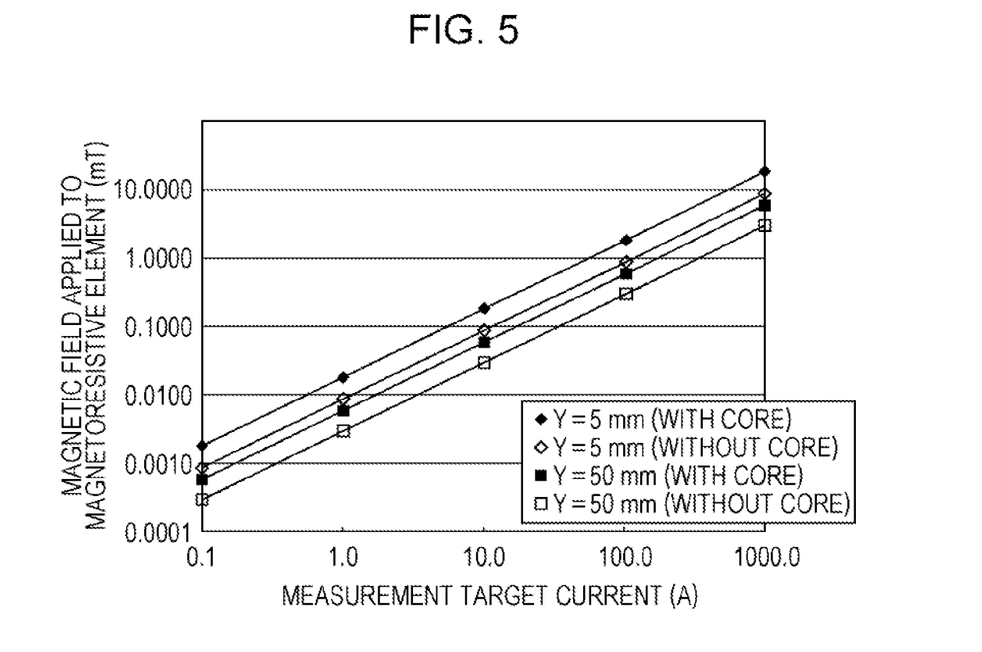
FIG. 5 is a graph of the magnitude of the magnetic field applied to the magnetoresistive element for the measurement target current.

For the above-mentioned current sensor, supposing that a distance from a conductor 11 having a radius of 17 mm to the magnetoresistive element 141 is 5 mm or 50 mm, the magnitude of the magnetic field applied to the magnetoresistive element for the measurement target current was obtained by simulation. Results of the simulation are illustrated in FIG. 5. Furthermore, in a configuration that is obtained by removing the magnetic cores 13 from the configuration illustrated in FIG. 4, supposing that the distance from the conductor 11 having a radius of 17 mm to the magnetoresistive element 141 is 5 mm or 50 mm, the magnitude of the magnetic field applied to the magnetoresistive element for the measurement target current was obtained by simulation. Results of the simulation are illustrated together in FIG. 5.

As illustrated in FIG. 5, even in the case in which the distance from the conductor 11 to the magnetoresistive element 141 is 5 mm and the case in which the distance is 50 mm, the magnetic field applied to the magnetoresistive element for the measurement target current in the configuration having the magnetic cores is larger.

Figure 6:
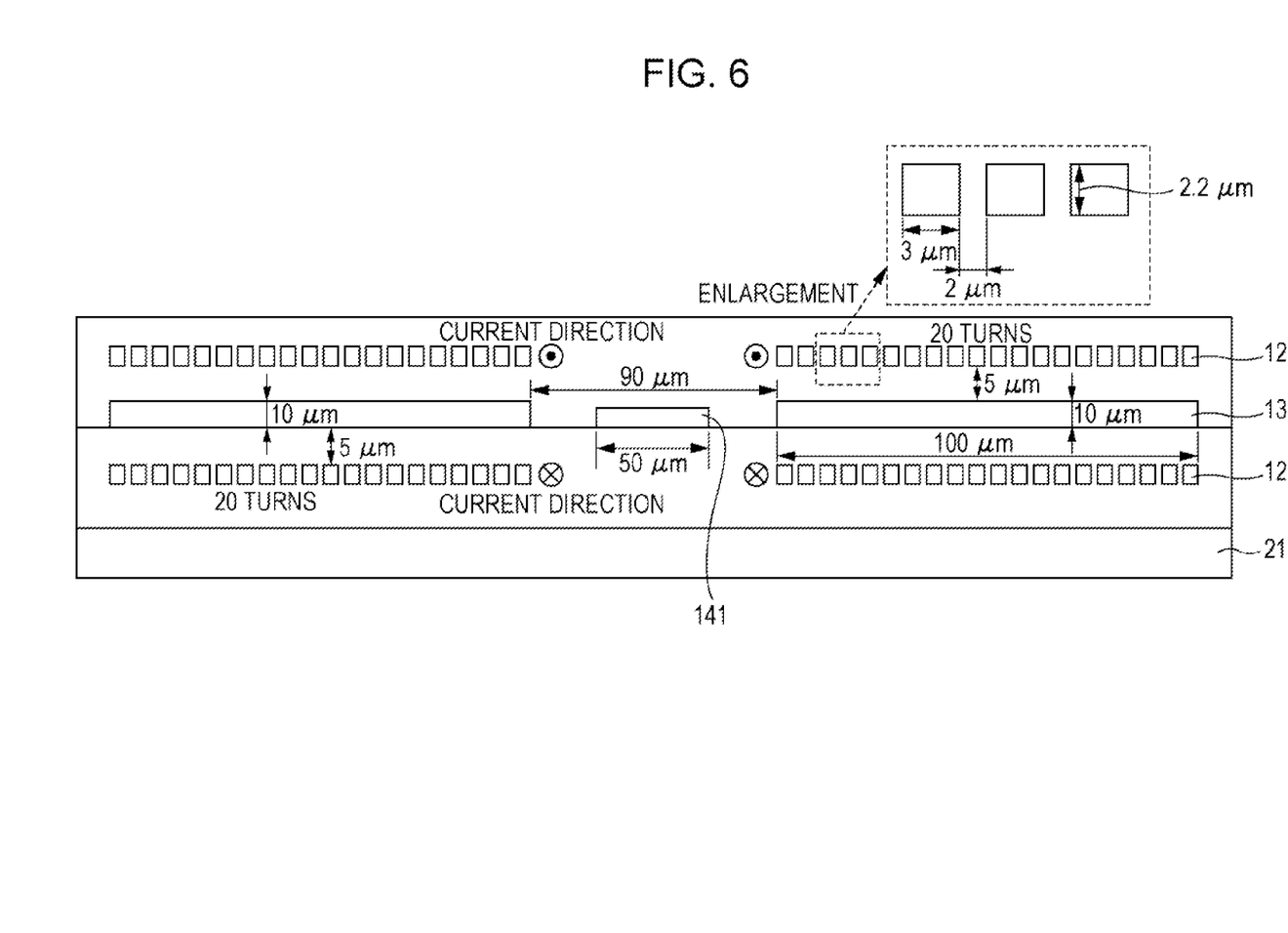
FIG. 6 is a diagram illustrating a configuration of a magnetic-balance-system current sensor according to the first embodiment, which is used to measure the magnitude of a magnetic field that is applied to a magnetoresistive element for a feedback current.

FIG. 6 is a diagram illustrating a configuration of a magnetic-balance-system current sensor used to measure the magnitude of a magnetic field that is applied to a magnetoresistive element for a current (a feedback current) flowing through a feedback coil. Regarding the magnetic-balance-system current sensor illustrated in FIG. 6, two magnetic cores (NiFe) 13 having a thickness of 10 µm and a length of 100 µm are disposed inside a feedback coil (Cu) 12 (a toroidal structure). Regarding the feedback coil 12, in cross-sectional view, the width thereof is 3 µm and the height thereof is 2.2 µm, and a coil-to-coil distance is 2 µm. Furthermore, the number of turns of the feedback coil on each side is 20. Moreover, a distance between the magnetic cores 13 is 90 µm. A magnetoresistive element 141 having a length of 50 µm is disposed between the two magnetic cores 13. In this configuration, the feedback coil 12, the magnetic cores 13, and a magnetic-field detecting bridge circuit (not illustrated) are formed on the same substrate.

Figure 7:
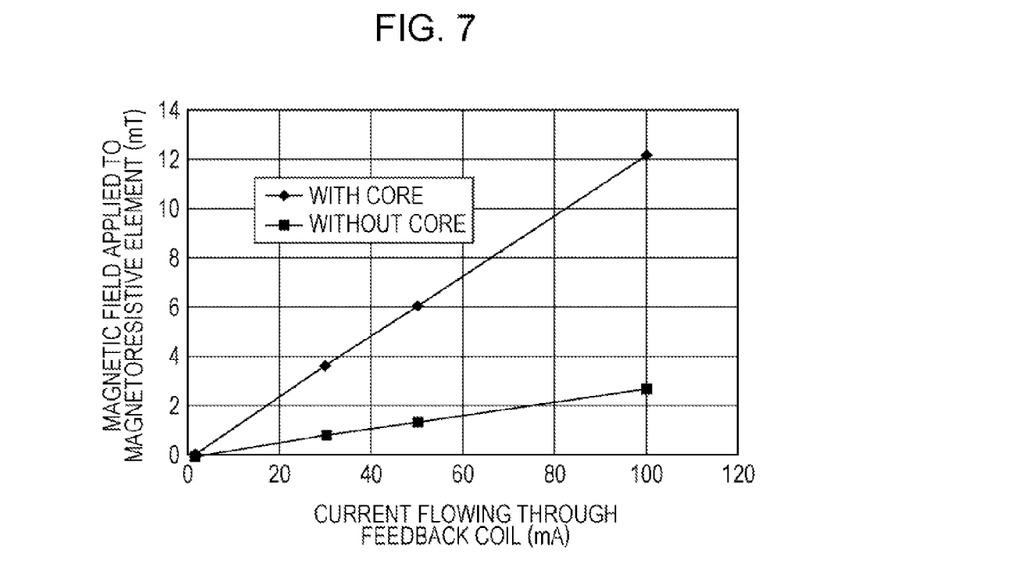
FIG. 7 is a graph of the magnitude of the magnetic field applied to the magnetoresistive element for the feedback current.

For the above-mentioned current sensor, the magnitude of the magnetic field applied to the magnetoresistive element for the feedback current was obtained by simulation. Results of the simulation are illustrated in FIG. 7. Furthermore, in a configuration that is obtained by removing the magnetic cores 13 from the configuration illustrated in FIG. 6, the magnitude of the magnetic field applied to the magnetoresistive element for the feedback current was obtained by simulation. Results of the simulation are illustrated together in FIG. 7.

As illustrated in FIG. 7, the magnetic field applied to the magnetoresistive element for the feedback current in the configuration having the magnetic cores is much larger. As described above, with the configuration having the magnetic cores, because both the magnetic field applied to the magnetoresistive element for the measurement target current and the magnetic field applied to the magnetoresistive element for the feedback current are large, a high-sensitivity magnetic-balance-system current sensor can be realized. Furthermore, regarding the magnetic-balance-system current sensor having the present configuration, because the feedback coil 12, the magnetic cores 13, and the magnetic-field detecting bridge circuit 14 are formed on the same substrate, the magnetic-balance-system current sensor can be miniaturized although the magnetic-balance-system current sensor has a structure having the magnetic cores 13.

Second Embodiment

In a present embodiment, a case will be described, in which a feedback coil is of a spiral type, and in which magnetic cores are provided above and below the feedback coil.

Figure 8:
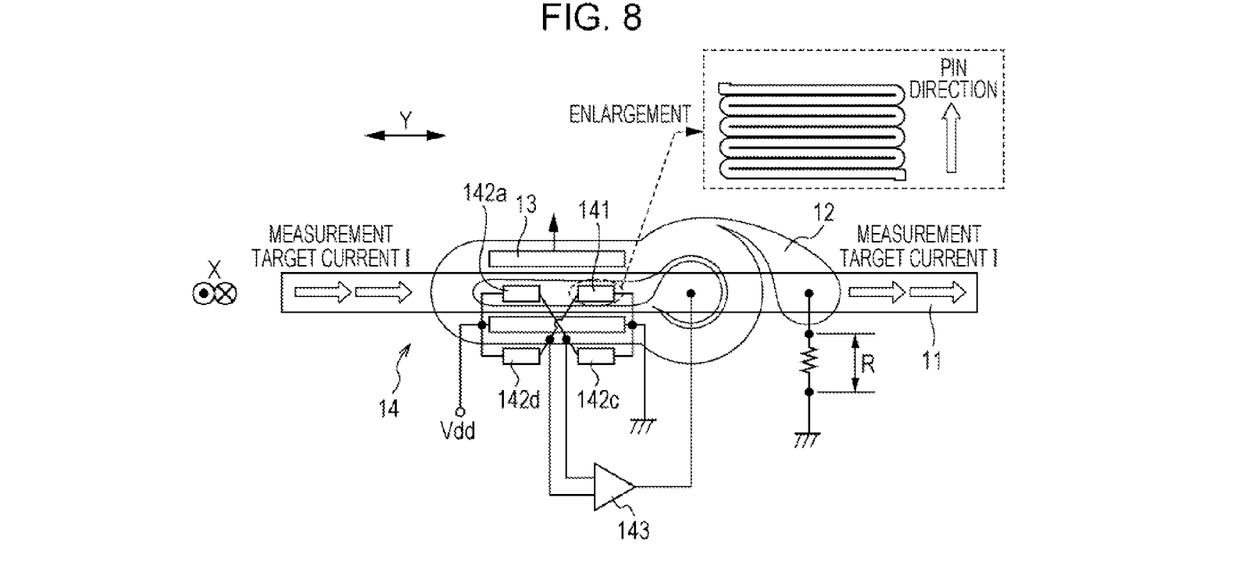
FIG. 8 is a diagram of a magnetic-balance-system current sensor according to a second embodiment of the present invention.
Figure 9:
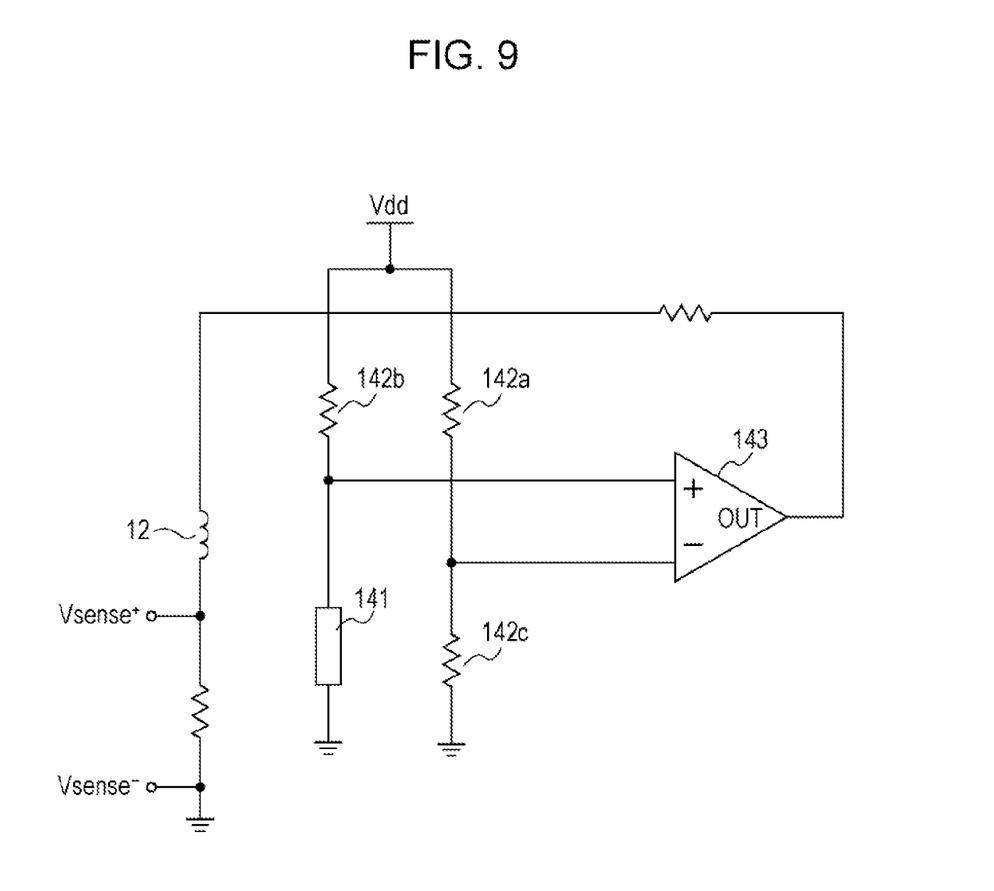
FIG. 9 is a circuit diagram of the magnetic-balance-system current sensor illustrated in FIG. 8.

FIG. 8 is a diagram of a magnetic-balance-system current sensor according to the second embodiment of the present invention. FIG. 9 is a circuit diagram of the magnetic-balance-system current sensor illustrated in FIG. 8. The magnetic-balance-system current sensor illustrated in FIG. 8 is disposed in the vicinity of a conductor 11 through which a measurement target current I flows. A feedback coil (planar coil) 12 is disposed so that a direction orthogonal to a direction in which the measurement target current I flows is an axial center direction X. The measurement target current I flows, thereby generating an induction magnetic field, and the feedback coil 12 generates a cancelling magnetic field that cancels out the induction magnetic field.

Furthermore, magnetic cores 13 are disposed so that an easy axis of magnetization is oriented in a direction Y (a direction that coincides with the current direction of the feedback coil 12) that is orthogonal to the axial center direction of the feedback coil 12. When the induction magnetic field generated by the measurement target current I and the cancelling magnetic field are balanced with each other (are in a state of equilibrium) inside the feedback coil 12, the easy axis of magnetization of the magnetic cores 13 is made orthogonal to the axial center direction of the feedback coil 12 so that a magnetic field applied to a magnetoresistive element 141 is zero, whereby a magnetic field caused by remanent magnetization can be prevented from being applied to the magnetoresistive element 141. Furthermore, in this manner, reverse magnetic fields (Hk) of the magnetic cores 13 are increased so that the cancelling magnetic field generated by the feedback coil 12 is not easily saturated, whereby a saturation magnetic field can be excessively increased.

Additionally, the magnetoresistive element 141 is disposed between the two magnetic cores 13. Regarding the magnetoresistive element 141, the resistance value thereof is changed by application of the induction magnetic field generated by the measurement target current I. Together with three fixed resistance elements 142a, 142b, and 142c, the magnetoresistive element 141 constitutes a magnetic-field detecting bridge circuit 14. By using the magnetic-field detecting bridge circuit 14 having the magnetoresistive element 141 as described above, a high-sensitivity magnetic-balance-system current sensor can be realized. Moreover, with this configuration, because the temperature dependency of outputs can be reduced by using a GMR element or TMR element, which has a resistance change rate that changes by a small amount for temperature, while TCRs (Temperature Coefficient Resistivities) of the magnetoresistive element and the fixed resistance elements are being made to coincide with each other, the temperature characteristics can be improved.

The magnetic-field detecting bridge circuit 14 has two outputs having a voltage difference therebetween, and the voltage difference is generated in accordance with the induction magnetic field generated by the measurement target current I. In the magnetic-field detecting bridge circuit illustrated in FIG. 8, a power supply Vdd is connected to a node between the fixed resistance elements 142a and 142b, and a ground (GND) is connected to a node between the magnetoresistive element 141 and the fixed resistance element 142c. Furthermore, in the magnetic-field detecting bridge circuit, one output is obtained from a node between the magnetoresistive element 141 and the fixed resistance element 142b, and another output is obtained from a node between the fixed resistance element 142a and the fixed resistance element 142c. These two outputs are amplified by an amplifier 143 so as to be provided as a current (a feedback current) for the feedback coil 12. The feedback current corresponds to the voltage difference generated in accordance with the induction magnetic field. In this case, a cancelling magnetic field that cancels out the induction magnetic field is generated in the feedback coil 12. Then, the measurement target current is measured by a detector (a detection resistor R) on the basis of a current that flows through the feedback coil 12 when the induction magnetic field and the cancelling magnetic field enter a state of equilibrium in which the induction magnetic field and the cancelling magnetic field cancel each other out.

Figure 10A:
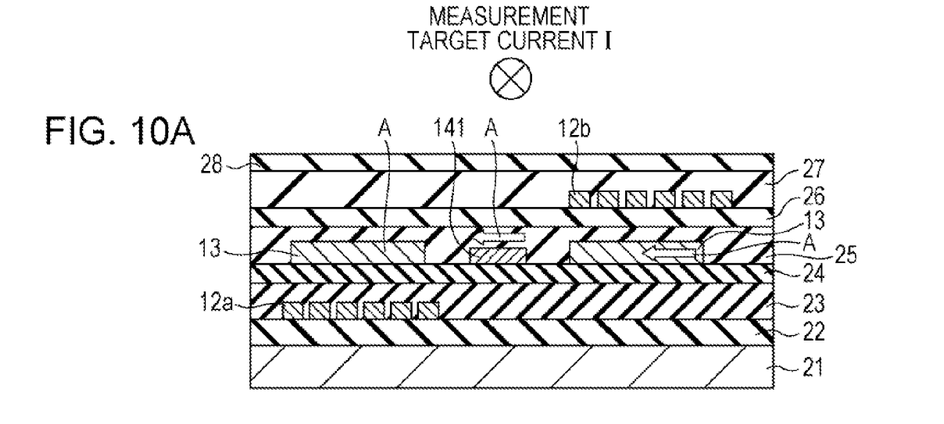
FIGS. 10A to 10C are diagrams for explaining an operation principal of the magnetic-balance-system current sensor.

FIG. 10A is a cross-sectional view of the magnetic-balance-system current sensor illustrated in FIG. 8. As illustrated in FIG. 10A, in the magnetic-balance-system current sensor according to the present embodiment, the feedback coil 12, the magnetic cores 13, and the magnetic-field detecting bridge circuit (only the magnetoresistive element 141 is illustrated) are formed on a same substrate 21. In a configuration illustrated in FIG. 10A, the magnetic cores 13 and the feedback coil 12 are disposed in the vicinity of the magnetoresistive element 141. Here, a configuration is employed, in which the magnetoresistive element 141 is disposed between two structures (a spiral structure of the feedback coil 12) that are a structure in which, in cross-sectional view, the feedback coil 12 is disposed below the magnetic core 13 and a structure in which the feedback coil 12 is disposed above the magnetic core 13. Moreover, the magnetoresistive element 141 is disposed between the two magnetic cores 13, and the magnetoresistive element 141 and the magnetic cores 13 are formed in the same plane. Because the magnetoresistive element 141 is disposed between the two magnetic cores 13, the induction magnetic field generated by the measurement target current I can be effectively applied to the magnetoresistive element 141. Additionally, because the magnetic cores 13 are disposed inside the feedback coil 12 and the magnetoresistive element 141 is disposed between the two magnetic cores 13, both of the two magnetic fields (the induction magnetic field and the cancelling magnetic field) can be relatively increased with respect to an unnecessary magnetic field such as the geomagnetic field, so that the accuracy of the current sensor can be more increased.

In this case, the feedback coil 12 is disposed so that the axial center direction of the feedback coil 12 is orthogonal to the direction in which the measurement target current I flows. The magnetic cores 13 are disposed so that the easy axis of magnetization is oriented in the direction (the direction that coincides with the current direction of the feedback coil 12) that is orthogonal to the axial center direction of the feedback coil 12.

Because a layer structure illustrated in FIG. 10A or constituent materials are the same as those in the first embodiment except that a pattern of the lower coil layer 12a and the upper coil layer 12b is of a spiral type, a detailed description is omitted.

Figure 10B:
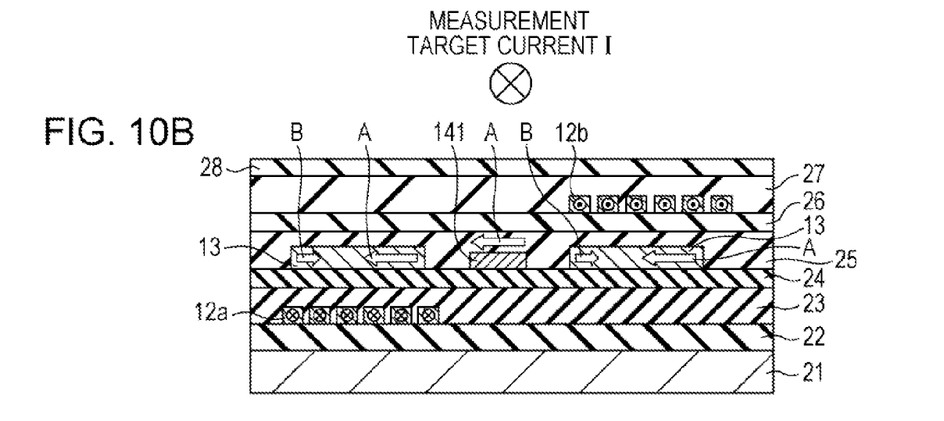
Figure 10C:
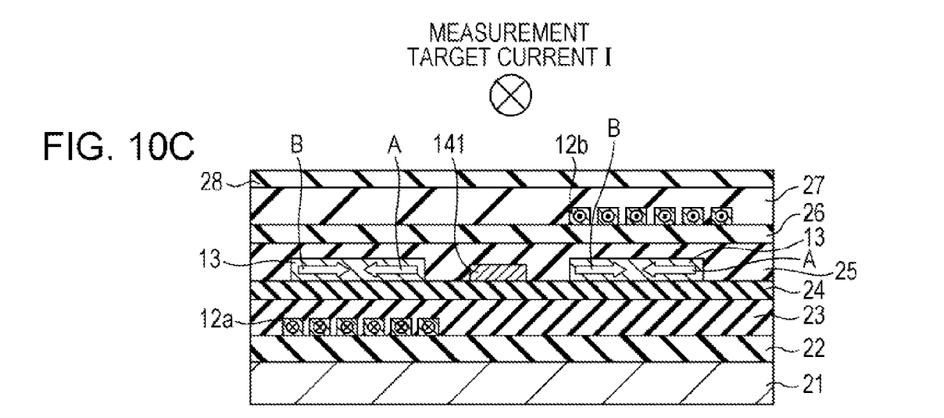

In the magnetic-balance-system current sensor having the above-described configuration, as illustrated in FIG. 10A, an induction magnetic field A generated by the measurement target current I is applied to the magnetoresistive element 141 through the magnetic cores 13. As illustrated in FIG. 10B, the induction magnetic field is fed back, and a cancelling magnetic field B is generated by the feedback coil 12. As illustrated in FIG. 10C, adjustment is appropriately performed so that the two magnetic fields (the induction magnetic field A and the cancelling magnetic field B) cancel each other out and a magnetic field applied to the magnetoresistive element 141 is zero.

Regarding the magnetic-balance-system current sensor having the above-described configuration, because the feedback coil 12, the magnetic cores 13, and the magnetic-field detecting bridge circuit 14 are formed on the same substrate, the magnetic-balance-system current sensor can be miniaturized although the magnetic-balance-system current sensor has a structure including the magnetic cores 13. Accordingly, the magnitude of the cancelling magnetic field can be increased, and, even when the measurement target current is a large current, the measurement target current can be measured. Moreover, because the magnetoresistive element, particularly, a GMR element or TMR element, is used as a magnetic detector element, the sensitivity of the current sensor can be increased.

Next, Example that was implemented in order to make effects of the present invention clear will be described.

Figure 11:
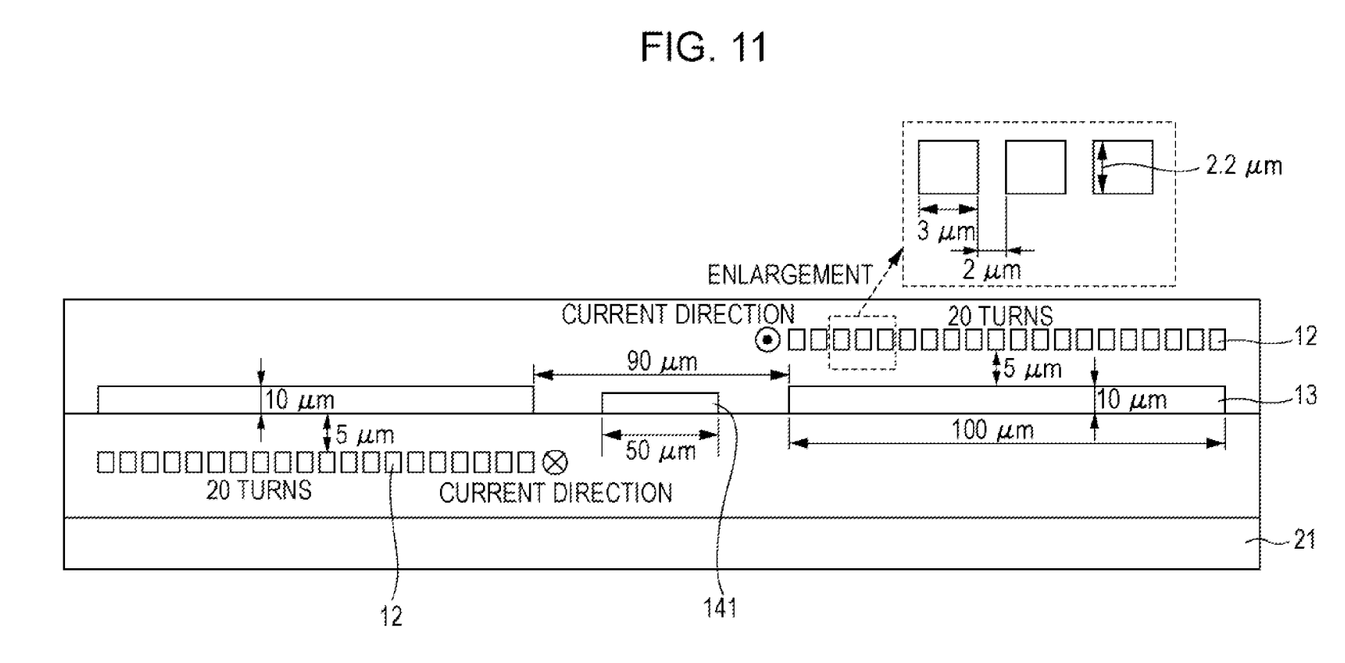
FIG. 11 is a diagram illustrating a configuration of a magnetic-balance-system current sensor according to the second embodiment, which is used to measure the magnitude of a magnetic field that is applied to a magnetoresistive element for a feedback current.

FIG. 11 is a diagram illustrating a configuration of a magnetic-balance-system current sensor used to measure the magnitude of the magnetic field applied to the magnetoresistive element for a current (a feedback current) flowing through a feedback coil. Regarding the magnetic-balance-system current sensor illustrated in FIG. 11, two magnetic cores (NiFe) 13 having a thickness of 10 µm and a length of 100 µm are disposed above and below a feedback coil (Cu) 12 (a spiral structure). Regarding the feedback coil 12, in cross-sectional view, the width thereof is 3 µm and the height thereof is 2.2 µm, and a coil-to-coil distance is 2 µm. Furthermore, the number of turns of the feedback coil on each side is 20. Moreover, the distance between the magnetic cores 13 is 90 µm. A magnetoresistive element 141 having a length of 50 µm is disposed between the two magnetic cores 13. In this configuration, the feedback coil 12, the magnetic cores 13, and a magnetic-field detecting bridge circuit (not illustrated) are formed on the same substrate.

Figure 12:
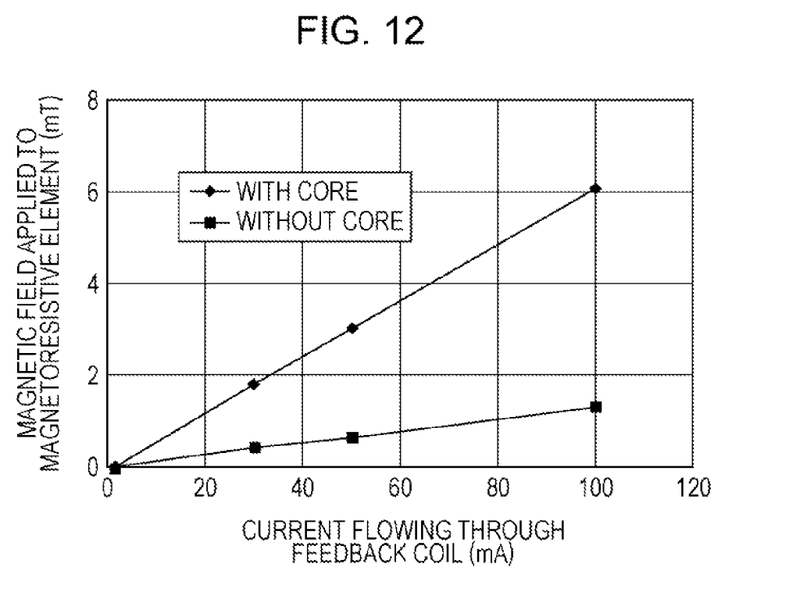
FIG. 12 is a graph of the magnitude of the magnetic field applied to the magnetoresistive element for the feedback current.

For the above-mentioned current sensor, the magnitude of the magnetic field applied to the magnetoresistive element for the feedback current was obtained by simulation. Results of the simulation are illustrated in FIG. 12. Furthermore, in a configuration that is obtained by removing the magnetic cores 13 from the configuration illustrated in FIG. 11, the magnitude of the magnetic field applied to the magnetoresistive element for the feedback current was obtained by simulation. Results of the simulation are illustrated together in FIG. 12.

As illustrated in FIG. 12, the magnetic field applied to the magnetoresistive element for the feedback current in the configuration having the magnetic cores is much larger. As described above, with the configuration having the magnetic cores, because both the magnetic field applied to the magnetoresistive element for the measurement target current and the magnetic field applied to the magnetoresistive element for the feedback current are large, a high-sensitivity magnetic-balance-system current sensor can be realized. Furthermore, regarding the magnetic-balance-system current sensor having the present configuration, because the feedback coil 12, the magnetic cores 13, and the magnetic-field detecting bridge circuit 14 are formed on the same substrate, the magnetic-balance-system current sensor can be miniaturized although the magnetic-balance-system current sensor has a structure having the magnetic cores 13.

The present invention is not limited to the first and second embodiments described above, and may be variously modified and implemented. For example, the materials, the arrangement positions of the individual layers, the thicknesses thereof, the sizes thereof, or the production methods therefor in the first and second embodiments described above may be appropriately modified, and then the present invention may be implemented. In addition, the present invention may be appropriately modified and implemented without departing from the range of the present invention.

What is claimed is:

1. A magnetic-balance-system current sensor comprising:
    a magnetic field detection bridge circuit, including:
        a magnetoresistive element, a resistance value of the magnetoresistive element changing depending on application of an induction magnetic field generated by a measurement target current; and
        an output configured to generate a voltage difference in accordance with the induction magnetic field;
    a magnetic core disposed in a vicinity of the magnetoresistive element;
    a feedback coil disposed in a vicinity of the magnetoresistive element, configured to receive a feedback current corresponding to the voltage difference, and generate, in accordance with the feedback current, a cancelling magnetic field for cancelling out the induction magnetic field; and
    a current detector configured to measure the measurement target current on the basis of the feedback current flowing through the feedback coil when the induction magnetic field and the cancelling magnetic field are in a state of equilibrium in which the induction magnetic field and the cancelling magnetic field cancel out each other,
    wherein the feedback coil, the magnetic core, and the magnetic-field detecting bridge circuit are formed on a same substrate, and
    wherein the feedback coil is of a spiral type, and the magnetic core is provided above and below the feedback coil.

2. The magnetic-balance-system current sensor according to claim 1, wherein the magnetic core includes a first magnetic core and a second magnetic core formed in a same plane, and wherein the magnetoresistive element is disposed between the first and second magnetic cores in the same plane.

3. The magnetic-balance-system current sensor according to claim 1, wherein the magnetic core has an easy axis of magnetization in a direction coincides with a current direction of the feedback coil.

4. The magnetic-balance-system current sensor according to claim 1, wherein the feedback coil has an axial center direction orthogonal to a direction in which the measurement target current flows, and the magnetic core has an easy axis of magnetization in a direction orthogonal to the axial center direction.

5. The magnetic-balance-system current sensor according to claim 1, wherein the magnetoresistive element is a spin-valve-type giant magnetoresistive element or tunneling magnetoresistive element.

6. The magnetic-balance-system current sensor according to claim 5, wherein the giant magnetoresistive element has a meandering shape having a width ranging from 1 µm to 10 µm, and a length in a longitudinal direction equal to or larger than twice the width, and the giant magnetoresistive element is disposed so that the longitudinal direction is perpendicular to both a direction of the induction magnetic field and a direction of the cancelling magnetic field.

7. The magnetic-balance-system current sensor according to claim 5, wherein the tunneling magnetoresistive element has a rectangular shape having a width ranging from 1 µm to 10 µm, and a length in a longitudinal direction equal to or larger than twice the width, and the tunneling magnetoresistive element is disposed so that the longitudinal direction is perpendicular to both a direction of the induction magnetic field and a direction of the cancelling magnetic field.

8. The magnetic-balance-system current sensor according to claim 1, wherein the magnetic core is formed of a high-magnetic-permeability material selected from a group consisting of an amorphous magnetic material, a permalloy magnetic material, and a ferrous microcrystalline material.

9. The magnetic-balance-system current sensor according to claim 2, wherein the feedback coils includes:
    a first spiral part formed below the first magnetic core; and
    a second spiral part formed above the second magnetic core.

10. The magnetic-balance-system current sensor according to claim 9, wherein the magnetoresistive element the, the feedback coil, and the magnetic core are configured such that, the first spiral part and the first magnetic core are placed on one side of the measurement target current, while the second spiral part and the second magnetic core are placed on the other side of the measurement target current, if the magnetoresistive element is aligned with the measurement target current.

11. The magnetic-balance-system current sensor according to claim 2, wherein the magnetic field detection bridge circuit includes:
    the magnetoresistive element; and
    three fixed resistance elements.

* * * * *